US008186233B2

(12) United States Patent
Joung et al.

(10) Patent No.: US 8,186,233 B2
(45) Date of Patent: May 29, 2012

(54) PRESSURE SENSING DEVICE

(75) Inventors: Ho-Chul Joung, Yongin-si (KR); Seong-Woo Kim, Yongin-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 172 days.

(21) Appl. No.: 12/649,866

(22) Filed: Dec. 30, 2009

(65) Prior Publication Data

US 2010/0313680 A1    Dec. 16, 2010

(30) Foreign Application Priority Data

Jun. 15, 2009  (KR) .................. 10-2009-0053020

(51) Int. Cl.
*G01L 1/00* (2006.01)
(52) U.S. Cl. ................................... 73/862.68
(58) Field of Classification Search ............. 73/862.046, 73/862.68
See application file for complete search history.

(56) References Cited

U.S. PATENT DOCUMENTS

| | | | | |
|---|---|---|---|---|
| 3,922,597 A | * | 11/1975 | Nagase | 323/367 |
| 5,231,386 A | * | 7/1993 | Brandenburg et al. | 345/174 |
| 5,689,285 A | * | 11/1997 | Asher | 345/161 |
| 6,347,555 B1 | * | 2/2002 | Namerikawa et al. | 73/862.637 |
| 7,256,768 B2 | * | 8/2007 | Bathiche | 345/168 |
| 2005/0072249 A1 | * | 4/2005 | Maeda et al. | 73/862.046 |

FOREIGN PATENT DOCUMENTS

| | | |
|---|---|---|
| JP | 2001-216866 | 8/2001 |
| KR | 10-0204286 | 6/1999 |
| KR | 10-2007-0012143 | 1/2007 |

OTHER PUBLICATIONS

Korean Office Action issued in Korean Patent Application No. 10-2009-0053020, dated Dec. 20, 2010.

\* cited by examiner

*Primary Examiner* — Lisa Caputo
*Assistant Examiner* — Octavia Davis-Hollington
(74) *Attorney, Agent, or Firm* — McDermott Will & Emery LLP

(57) ABSTRACT

An input device that is capable of sensing how hard a user is pressing when contacted is disclosed. The input device includes a pressure sensing unit generating an electrical signal in accordance with pressure applied on one surface of the pressure sensing unit and a fixed resistance making a parallel electrical connection with the pressure sensing unit. Thus, not only can the input device receive a form of information that is changed proportionally in accordance with the pressure applied by the user, but the deviation in electrical characteristics that may occur during the manufacturing of different products can also be reduced. Also, by adjusting the resistance value of the fixed resistance, the sum of the resistance values by the parallel connection between the fixed resistance and the pressure sensitive resistance can be adjusted so that the electrical signal generated by the input device through pressing can be adjusted.

1 Claim, 4 Drawing Sheets

PRESSURE SENSING DEVICE

CROSS-REFERENCE TO RELATED APPLICATIONS

This application claims the benefit of Korean Patent Application No. 10-2009-0053020, filed with the Korean Intellectual Property Office on Jun. 15, 2009, the disclosure of which is incorporated herein by reference in its entirety.

BACKGROUND

1. Technical Field

The present invention relates to an input device that is capable of sensing how hard a user is pressing when contacted.

2. Description of the Related Art

Mobile devices, such as mobile phones, are equipped with a key pad, typically with 12 keys numbered between 0 and 9 and * and # signs. The key pad also has letters, such as English letters and Korean consonants and vowels, displayed with the numbers so that the letters and numbers can be inputted using the 12 keys.

Also, an input device, which performs various functions such as searching phone numbers, creating and managing text messages, and connecting to the Internet, is formed above the key pad. Such input device is configured in such a way that certain information may be inputted by pressing down the center and/or periphery of its circular button.

In step with the increasing diversification of the mobile device, the use of this type of input device is expanded to a variety of mobile devices, such as personal digital assistants (PDA), portable multimedia players (PMP), MPEG audio layers (MP3), car navigation devices, potable game players and digital cameras.

On top of the expanded application of the input device, the functions of the mobile devices have become more sophisticated and diversified, and consumers demand that various forms of information can be inputted in the input device. Particularly, a simple on-off operation is not sufficient for, for example, moving the menus or controlling the volume.

SUMMARY

The present invention provides an input device that can input various forms of information with improved reliability.

An aspect of the present invention provides an input device that includes a pressure sensing unit, which generates an electrical signal in accordance with pressure applied on one surface of the pressure sensing unit, and a fixed resistance, which makes a parallel electrical connection with the pressure sensing unit.

Here, the input device can further include a dome-switch unit, which generates an electrical signal by pressing the dome-switch unit, and the dome-switch unit can be electrically connected to the pressure sensing unit. Here, the dome-switch unit can include a central terminal, which is electrically connected to the pressure sensing unit, a perimeter terminal, which is separated from the central terminal, and a metal dome, which covers the central terminal and the perimeter terminal so as to electrically connect the central terminal to the perimeter terminal.

Also, the pressure sensing unit can include connection terminals, which are separated from each other, and a pressure sensitive resistance, which is placed facing the connection terminals and in which a resistance value of the pressure sensitive resistance is changeable in accordance with a pressure applied on one surface thereof. Here, the central terminal can be disposed on the pressure sensing unit so as to press the pressure sensitive resistance.

Additional aspects and advantages of the present invention will be set forth in part in the description which follows, and in part will be obvious from the description, or may be learned by practice of the invention.

DETAILED DESCRIPTION

Figure 1:
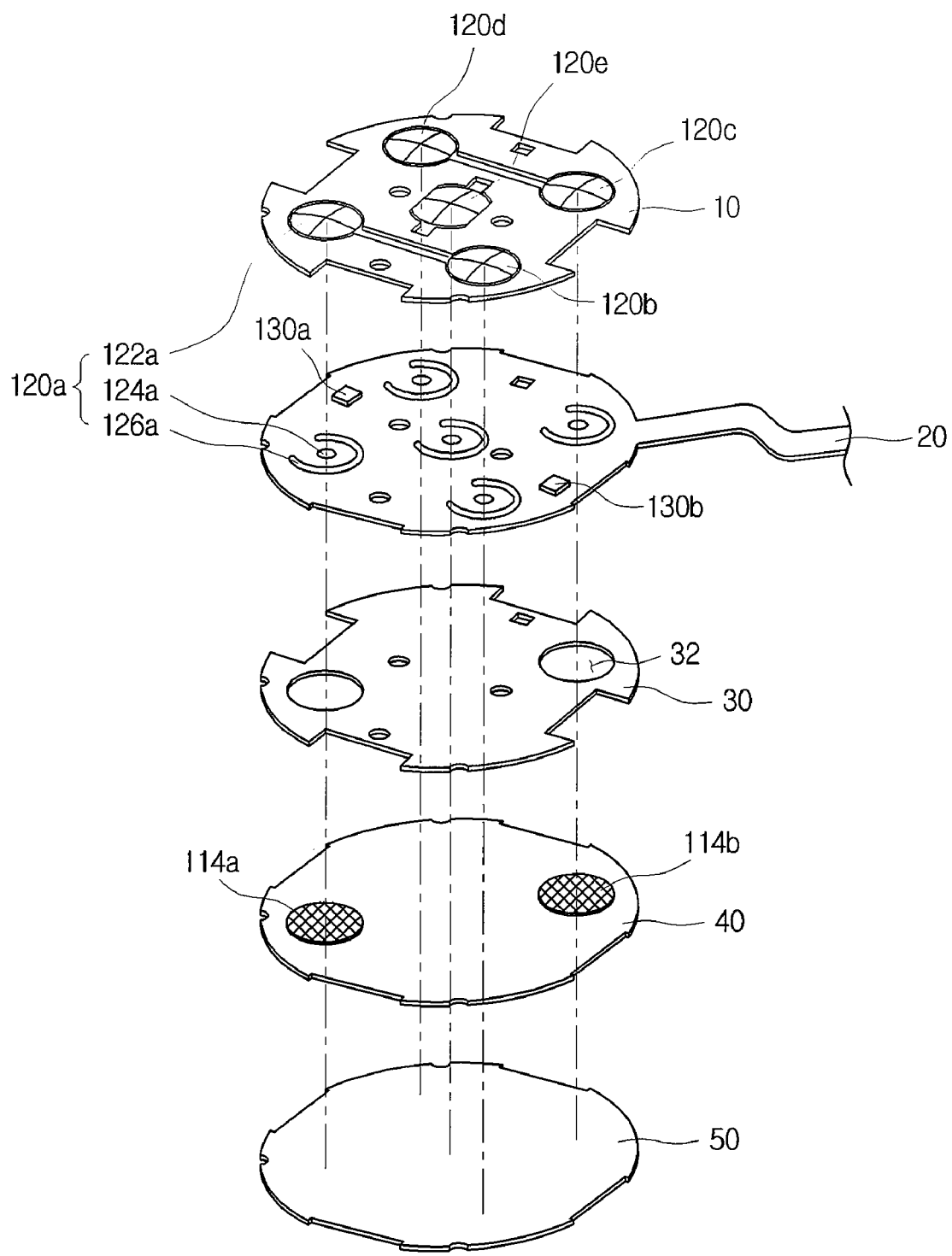
FIG. 1 is an exploded perspective view of an input device in accordance with an embodiment of the present invention.

The features and advantages of this invention will become apparent through the below drawings and description.

An input device according to a certain embodiment of the present invention will be described below in more detail with reference to the accompanying drawings. Those components that are the same or are in correspondence are rendered the same reference numeral regardless of the figure number, and redundant descriptions are omitted.

FIG. 1 is an exploded perspective view of an input device in accordance with an embodiment of the present invention. As in the example illustrated in FIG. 1, an input device 100 according to an embodiment of the present invention includes a pressure sensitive resistance 114, which changes its resistance value in accordance with a pressure applied on one surface thereof, and a fixed resistance 130, which is electrically connected parallel to the pressure sensitive resistance 114. Thus, not only can the input device 100 receive a form of information that is changed proportionally in accordance with the pressure applied by the user, but the deviation in electrical characteristics that may occur during the manufacturing of different products can also be reduced.

Information can be inputted by the pressure applied by the user through the input device 100, which can be employed as an input unit of various types of mobile devices. The input device 100 is electrically connected to a control unit of an electronic device in which the input device 100 mounted, and transmits an electrical signal to the control unit in accordance with the operation of the user. Thus, the information inputted by the user can be transferred to the electronic device.

As illustrated in FIG. 1, the input device 100 can be implemented in the form of a key pad by stacking a dome sheet 10, a flexible substrate 20, an upper tape 30, a sensor sheet 40 and a lower tape 50 on top of each other.

A plurality of metal domes 122 are formed on the dome sheet 10. The overall shape of the dome sheet 10 is generally circular, and one metal dome is formed at the center of the dome sheet 10, and four metal domes 122 are formed in four directions on the perimeter of the dome sheet 10.

The dome sheet 10 is made of a flexible resin material, and the metal dome 122 is made of a conductive material having elastic restoration capability.

An electronic component and a circuit pattern constituting the input device 100 can be formed on the flexible substrate (PCB) 20. Also, a central terminal 124 and a perimeter terminal 126 can be formed on the flexible substrate 20 at positions corresponding to the metal dome 122, and a fixed resistance 130 can be also formed on the flexible substrate 20.

An opening 32 can be formed in the upper tape 31 at a position corresponding to a pressure sensitive resistance 114, which will be described later. The upper tape 30 is as thick as the distance between the pressure sensitive resistance 114 and the central terminal 124, which will be described later.

The pressure sensitive resistance 114 can be coated on the sensor sheet 40. The pressure sensitive resistance 114 can be formed on the sensor sheet 40 to match the position and shape of the metal dome 122.

The lower tape 50 can cover the lower surface of the sensor sheet 40, and can protect the bottom surface of the input device 100.

A dome-switch unit 120 can generate an electrical signal by the pressure applied by the user. A single dome-switch unit 120a can be constituted by a metal dome 122a, a central terminal 124a and a perimeter terminal 126a. The central terminal 124a is formed at the center of the metal dome 122a, and can be formed in the shape of a via in the flexible substrate 20. The perimeter terminal 126a is adjacent to the central terminal 124a and surrounds the central terminal 124a at a separated distance from the central terminal 124a. Therefore, the perimeter terminal 126a is formed in the shape of a circular arc.

Figure 2:
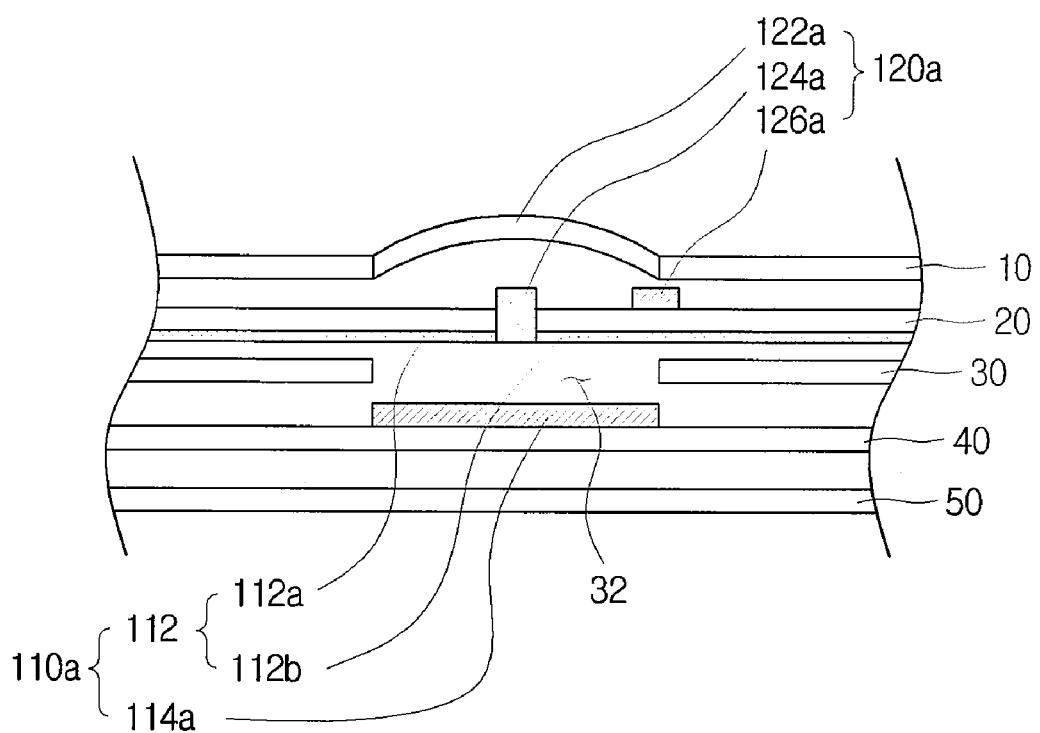
FIG. 2 is a cross-sectional view illustrating a portion of an input device in accordance with an embodiment of the present invention.

FIG. 2 is a cross-sectional view illustrating a portion of an input device 100 in accordance with an embodiment of the present invention. As illustrated in FIGS. 1 and 2, the perimeter terminal 126a can support the perimeter of the circular shaped metal dome 122a, and can be electrically connected to the metal dome 122a.

When the user presses the metal dome 122a, the center portion of the metal dome 122a can be indented towards the central terminal 124a so that the center portion of the metal dome 122a is in electrical contact with the central terminal 124a. After an electrical connection is formed between the central terminal 124a and the perimeter terminal 126a, a predetermined electrical signal can be transmitted to the control unit of the electronic device so that the information required by the user can be transferred to the electronic device.

Figure 3:
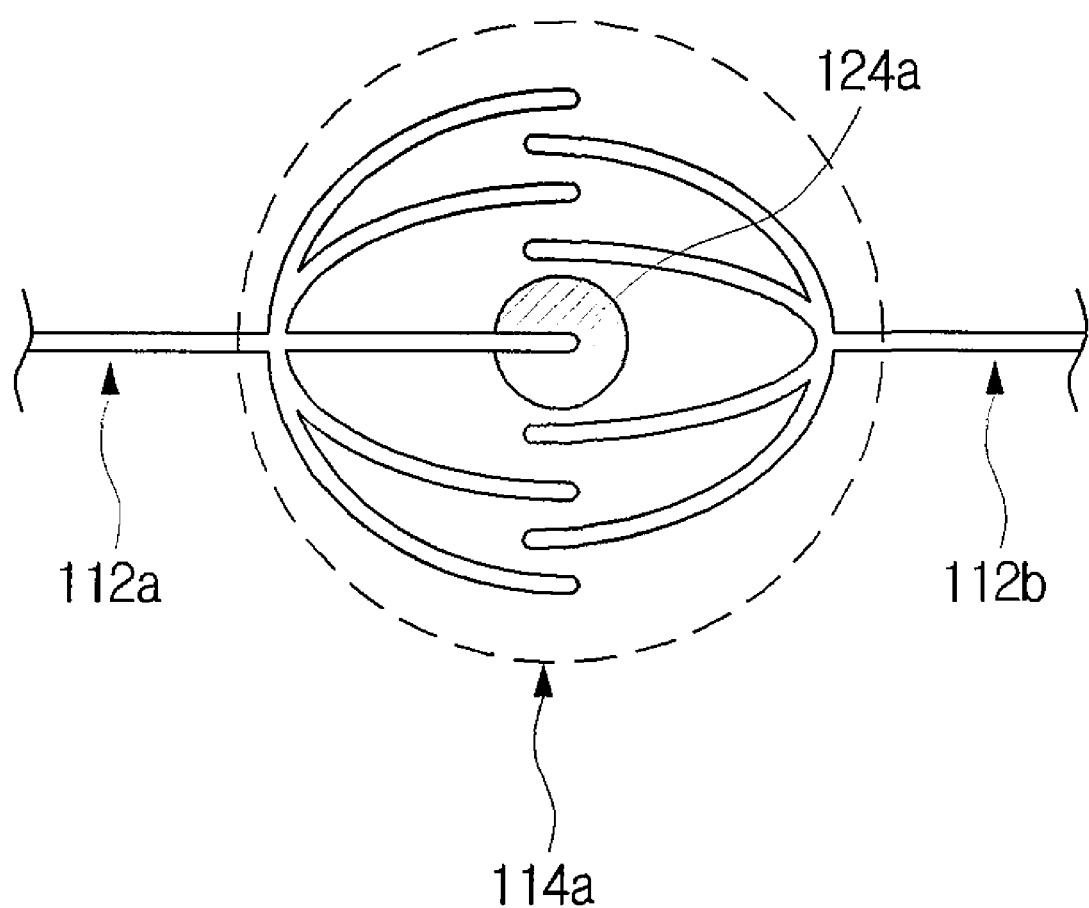
FIG. 3 is a bottom view illustrating a flexible substrate of an input device in accordance with an embodiment of the present invention.

FIG. 3 is a bottom view illustrating a flexible substrate 20 of an input device 100 in accordance with an embodiment of the present invention. As illustrated in FIGS. 2 and 3, a pressure sensing unit 110a is constituted by a connection terminal 112 and a pressure sensitive resistance 114a.

The connection terminal 112, i.e., the unit constituted by a left-hand connection terminal 112a and a right-hand connection terminal 112b, can be formed on the lower surface of the flexible substrate 20. The left-hand connection terminal 112a and the right-hand connection terminal 112b can be separated from each other and into several strands such that their respective ends can cross one another. The pressure sensitive resistance 114a or 114b can be formed on a surface of the sensor sheet 40 facing the connection terminal 112. The central terminal 124a can be electrically connected to the left-hand connection terminal 112a and the right-hand connection terminal 112b by way of the pressure sensitive resistance 114a or 114b.

The pressure sensitive resistance 114a, which is a substance in the form of ink having a conductive substance and a binder mixed together therein, can be coated on the sensor sheet 40. When a force or a pressure is applied on one surface of the pressure sensitive resistance 114a, the conductive substances inside the pressure sensitive resistance 114a make contact with one another, lowering the resistance value.

When the pressure applied on one surface of the pressure sensitive resistance 114a is slowly increased, the amount of the conductive substances making contact with one another inside the pressure sensitive resistance 114a also increases, thus constantly lowering the resistance value to a certain level.

When a user presses the metal dome 122a, an electrical connection may be formed between the central terminal 124a and the perimeter terminal 126a due to the deformation of the metal dome 122a so that an electrical signal can be generated. When the user presses the metal dome 122a further, the contacting pressure between the connection terminal 112 and the pressure sensitive resistance 114a becomes greater.

While the conductive substances inside the pressure sensitive resistance 114a contact one another, the resistance value of the pressure sensitive resistance 114a decreases so that an electrical input signal, which is proportionally reduced in connection with the resistance value, can be inputted into the electronic device.

Conversely, when the pressure applied to the metal dome 122a by the user is gradually reduced, the resistance value of the pressure sensitive resistance 114a increases due to an effect opposite to the above-mentioned mechanism so that an electrical input signal, which is proportionally increased in connection with the resistance value, can be inputted into the electronic device.

Thus, the user can input a proportionally increasing or decreasing electrical signal into the electronic device by way of the pressure sensing unit 110a. As a result, a plurality of laterally extending menus can be displayed on the screen of the electric device, and thus while pressing the metal dome 122a, in which the press sensing unit 110a of the input device 100 is installed, the user can gradually adjust the vertical moving speed of the menus.

When the user adjusts the volume of an electronic device such as an MP3 player, the changing speed of the volume can be adjusted by pressing the metal dome 122a, in which the pressure sensing unit 110a is installed. As such, the input device 100 can make a proportionally changing input into the electronic device by changing the magnitude of an electrical signal that is transmitted to the electronic device by way of the pressure sensing unit 110a.

Figure 4:
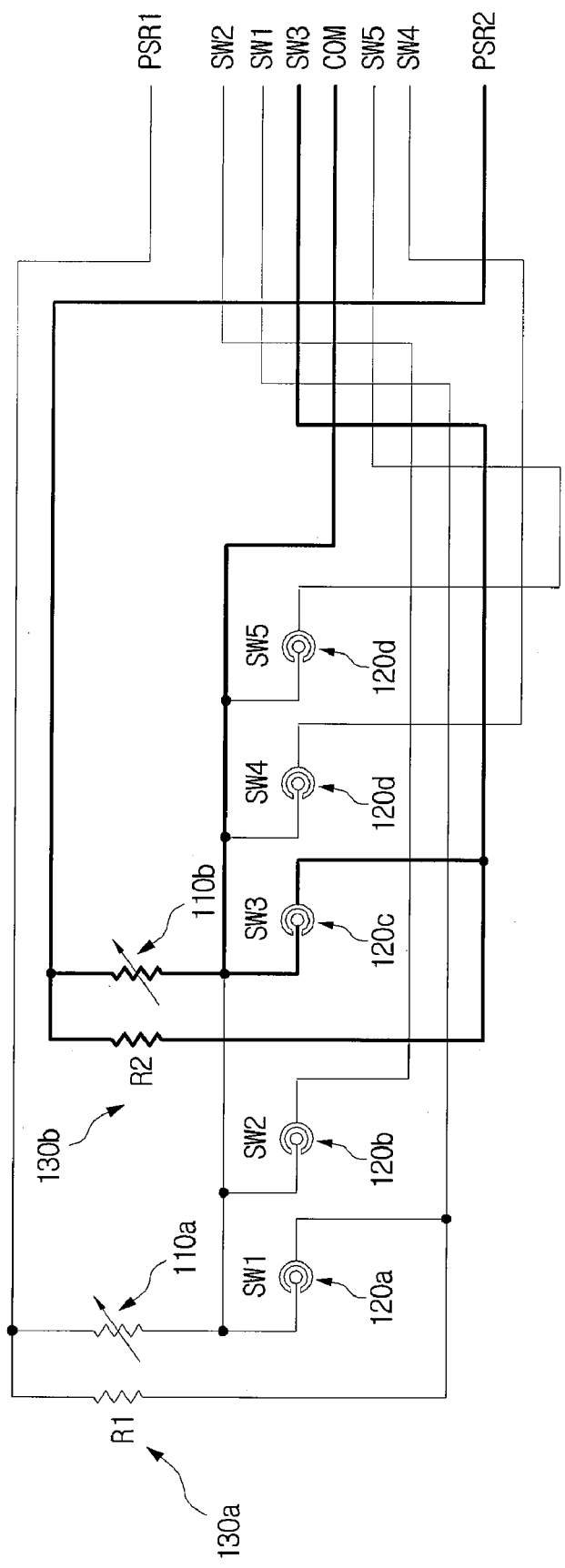
FIG. 4 is a circuit schematic of an input device in accordance with an embodiment of the present invention.

FIG. 4 is a circuit schematic of an input device 100 in accordance with an embodiment of the present invention. As illustrated in FIG. 4, the input device 100 has five dome-switch units 120a, 120b, 120c, 120d and 120e. Among them, two dome-switch units 120a and 120b are electrically connected with two pressure sensing units 110a and 110b.

The input device 100 includes fixed resistances 130a and 130b that are electrically connected parallel to the pressure sensing units 110a and 110b, respectively. The fixed resistances have a fixed resistance value. The fixed resistances 130a and 130b are electrically connected parallel to the pressure sensing units 110a and 110b so that the fixed resistances 130a and 130b can be connected parallel to the pressure sensitive resistances 114a and 114b, respectively.

In one example, if the user presses the metal dome to form an electrical connection in the dome-switch unit 120c, an electrical signal is formed between the COM channel and the SW3 channel. Furthermore, if the user continues to press the metal dome to form an electrical connection in the pressure sensing unit 110b, the electrical signal obtained between the PSR2 channel and the COM channel can be determined by the sum of the resistance values between the fixed resistance 110b and the pressure sensitive resistance 114b.

Even if the resistance value of the pressure sensitive resistance 114b has a deviation in the manufacturing process, it may minimize an effect on the deviation of the overall value of the pressure sensing unit 110b (that is, a deviation of the electrical signals being transferred by the pressure sensing unit 110b to the control unit of the electronic device) if the value of the fixed resistance R2 is greater than that of the pressure sensitive resistance 114b.

Furthermore, even if the pressure sensitive resistances 114a and 114b have a deviation in the resistance values due to the pressure changes by noise, the fixed resistances 130a and 130b can minimize such effect caused by the deviation.

Also, by adjusting the resistance value of the fixed resistance 130b, the sum of the resistance values by the parallel connection between the fixed resistance 130b and the pressure sensitive resistance 114b can be adjusted so that the electrical signal generated by the input device 100 through pressing can be adjusted.

While the spirit of the present invention has been described in detail with reference to a particular embodiment, the embodiment is for illustrative purposes only and shall not limit the present invention. It is to be appreciated that those skilled in the art can change or modify the embodiment without departing from the scope and spirit of the present invention.

What is claimed is:

1. An input device comprising:
   a pressure sensing unit configured to generate an electrical signal in accordance with pressure applied on one surface of the pressure sensing unit; and
   a dome-switch unit configured to generate an electrical signal by pressing the dome-switch unit,
   wherein the pressure sensing unit comprises:
      connection terminals separated from each other; and
      a pressure sensitive resistance placed facing the connection terminals a resistance value of the pressure sensitive resistance being changeable in accordance with a pressure applied on one surface thereof,
   wherein the dome-switch unit comprises:
      a central terminal electrically connected to the pressure sensing unit and disposed on the pressure sensing unit so as to press the pressure sensitive resistance;
      a perimeter terminal separated from the central terminal; and
      a metal dome covering the central terminal and the perimeter terminal so as to electrically connect the central terminal to the perimeter terminal.

* * * * *